(12) United States Patent
Sonoda (10) Patent No.: US 10,790,442 B2
(45) Date of Patent: Sep. 29, 2020

(54) MAGNETIC MEMORY DEVICE

(71) Applicant: TOSHIBA MEMORY CORPORATION, Minato-ku, Tokyo (JP)

(72) Inventor: Yasuyuki Sonoda, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 5 days.

(21) Appl. No.: 16/117,954

(22) Filed: Aug. 30, 2018

(65) Prior Publication Data

US 2019/0280195 A1      Sep. 12, 2019

(30) Foreign Application Priority Data

Mar. 9, 2018   (JP) .................. 2018-043467

(51) Int. Cl.
  *H01L 43/12*   (2006.01)
  *H01L 27/22*   (2006.01)
  *H01L 43/02*   (2006.01)
  *H01L 43/10*   (2006.01)

(52) U.S. Cl.
  CPC ............ *H01L 43/12* (2013.01); *H01L 27/222* (2013.01); *H01L 43/02* (2013.01); *H01L 43/10* (2013.01)

(58) Field of Classification Search
  CPC ......... H01L 43/02; H01L 43/08; H01L 43/10; H01L 43/12; G11C 11/14–16; G11C 11/161
  See application file for complete search history.

(56) References Cited

U.S. PATENT DOCUMENTS

| 9,105,572 | B2 * | 8/2015 | Kanaya ................. H01L 27/222 |
| 9,508,922 | B2 * | 11/2016 | Yoshikawa ............ H01L 43/08 |
| 10,355,198 | B2 * | 7/2019 | Liao ..................... H01L 27/228 |
| 2013/0316536 | A1 | 11/2013 | Seto et al. |
| 2014/0170776 | A1 | 6/2014 | Satoh et al. |
| 2015/0104882 | A1 | 4/2015 | Jung et al. |
| 2016/0380028 | A1 | 12/2016 | Sonoda et al. |
| 2017/0263858 | A1 | 9/2017 | Sonoda et al. |

FOREIGN PATENT DOCUMENTS

JP      2013243307 A    12/2013

* cited by examiner

*Primary Examiner* — Allison Bernstein
(74) *Attorney, Agent, or Firm* — Holtz, Holtz & Volek PC (57) ABSTRACT

According to one embodiment, a magnetic memory device includes a lower structure, a stacked structure provided on the lower structure and including a first magnetic layer having a variable magnetization direction, a second magnetic layer having a fixed magnetization direction, and a nonmagnetic layer provided between the first magnetic layer and the second magnetic layer, and a first sidewall insulating layer which is provided along a sidewall of the stacked structure and whose per end is located lower than an upper surface of the nonmagnetic layer.

10 Claims, 8 Drawing Sheets

MAGNETIC MEMORY DEVICE

CROSS-REFERENCE TO RELATED APPLICATIONS

This application is based upon and claims the benefit of priority from Japanese Patent Application No. 2018-043467, filed Mar. 9, 2018, the entire contents of which are incorporated herein by reference.

FIELD

Embodiments described herein relate generally to a magnetic memory device.

BACKGROUND

A magnetic memory device (semiconductor integrated circuit device) in which a magnetoresistive element and a MOS transistor are integrated on a semiconductor substrate has been proposed.

A stacked structure (stacked pattern) of the magnetoresistive element is formed by etching a stacked film including a magnetic layer.

However, there is a problem that an etched metal material redeposits on a sidewall of the stacked structure, resulting in electrical short failure.

DETAILED DESCRIPTION

In general, according to one embodiment, a magnetic memory device includes: a lower structure a stacked structure provided on the lower structure and including a first magnetic layer having a variable magnetization direction, a second magnetic layer having a fixed magnetization direction, and a nonmagnetic layer provided between the first magnetic layer and the second magnetic layer; and a first sidewall insulating layer which is provided along a sidewall of the stacked structure and whose upper end is located lower than an upper surface of the nonmagnetic layer.

Hereinafter, embodiments will be described with reference to the drawings.

Figure 1:
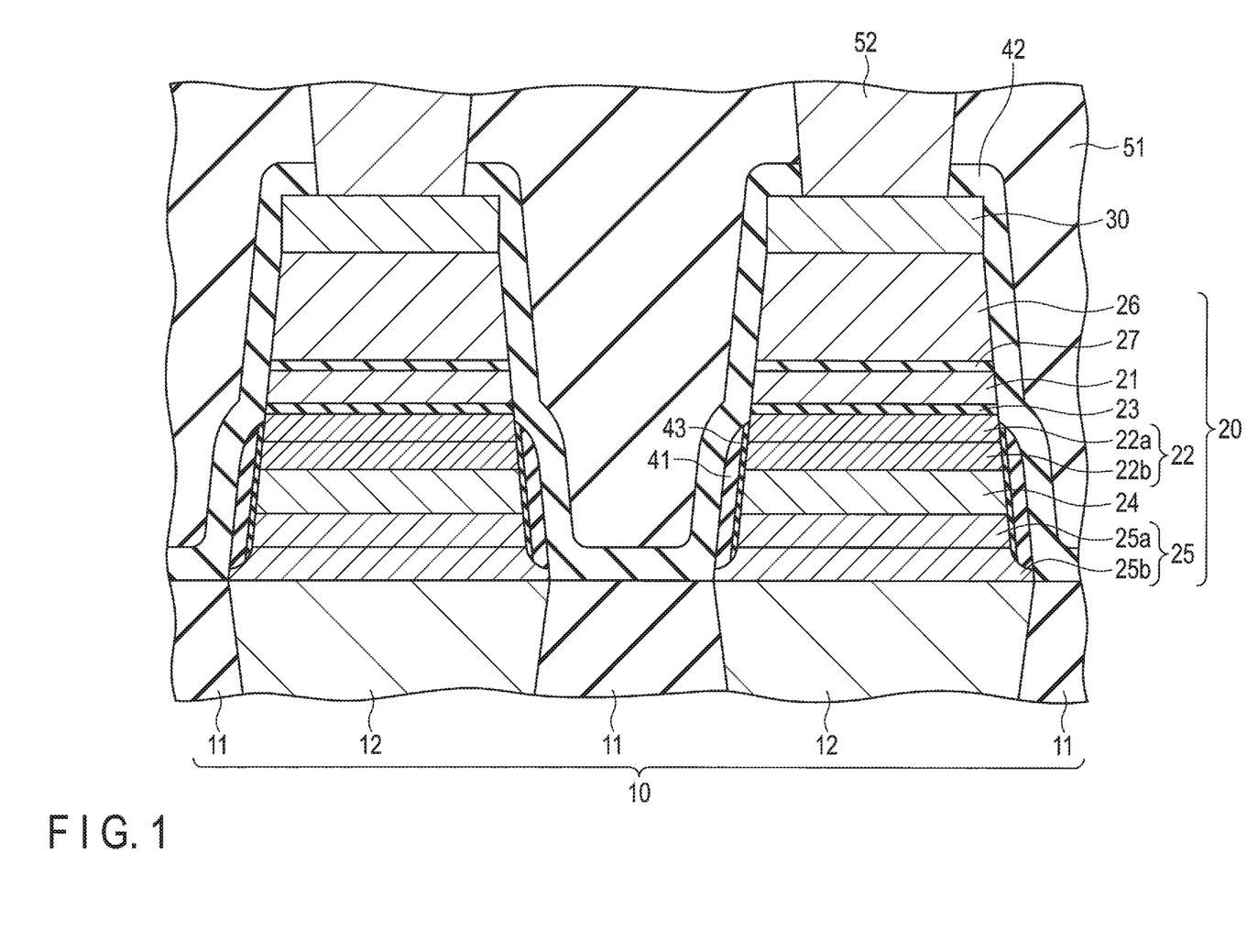
FIG. 1 is a cross-sectional view schematically showing a configuration of a magnetic memory device according to an embodiment.

FIG. 1 is a cross-sectional view schematically showing a configuration of a magnetic memory device (semiconductor integrated circuit device) according to an embodiment.

The lower structure 10 includes a semiconductor substrate (not shown), a MOS transistor (not shown), an interlayer insulating film 11, a bottom electrode 12, and the like. The MOS transistor is provided in a surface region of the semiconductor substrate. The bottom electrode 12 is provided in the interlayer insulating film 11 and electrically connects the MOS transistor and a magnetoresistive element to be described later.

On the lower structure 10, a stacked structure 20 for a magnetoresistive element is provided. The magnetoresistive element is also called MTV (magnetic tunnel junction) element.

The stacked structure 20 includes a storage layer 21 as a first magnetic layer, a reference layer 22 as a second magnetic layer, a tunnel barrier layer 23 as a nonmagnetic layer, a shift canceling layer 24 as a third magnetic layer, an under layer 25, a cap layer 26, and an intermediate layer 27.

The storage layer (first magnetic layer) 21 is a ferromagnetic layer having perpendicular magnetization (having a magnetization direction perpendicular to its main surface) and has a variable magnetization direction. In this embodiment, the storage layer 21 is formed of CoFeB, FeB, NgFeO, or the like.

The reference layer (second magnetic layer) 22 is a ferromagnetic layer having perpendicular magnetization and has a fixed magnetization direction. The reference layer 22 includes a first layer portion 22a and a second layer portion 22b. In this embodiment, the first layer portion 22a is formed of CoFeB, FeB, MgFeO, or the like. The second layer portion 22b contains cobalt (Co) and at least one element selected from platinum (Pt), nickel (Ni), and palladium (Pd). In this embodiment, the second layer portion 22b is formed from a superlattice such as Co/Pt, Co/Ni or Co/Pd.

The fact that the magnetization direction is variable means that the magnetization direction varies with respect to a predetermined write current, and the fact that the magnetization direction is fixed means that the magnetization direction does not vary with respect to a predetermined write current.

The tunnel barrier layer (nonmagnetic layer) 23 is an insulating layer provided between the storage layer 21 and the reference layer 22. In this embodiment, the tunnel barrier layer 23 is formed of MgO, AlO, or the like. For the tunnel barrier layer 23, nitrides of elements such as Al, Si, Be, Mg, Ca, Sr, Ba, Sc, Y, La, Zr, and Hf may be used.

The shift canceling layer (third magnetic layer) 24 is a ferromagnetic layer having perpendicular magnetization and has a fixed magnetization direction antiparallel to the magnetization direction of the reference layer 22. Provision of the shift canceling layer 24 allows cancellation of a magnetic field applied from the reference layer 22 to the storage layer 21. The shift canceling layer 24 contains cobalt (Co) and at least one element selected from platinum (Pt), nickel (Ni), and palladium (Pd). In this embodiment, the shift canceling layer 24 is formed from a superlattice such as Co/Pt, Co/Ni or Co/Pd.

As can be seen from the above description, in this embodiment, the reference layer 22 is provided between the lower structure 10 and the tunnel barrier layer 23, and the shift canceling layer 24 is provided between the lower structure 10 and the reference layer 22. Accordingly, the storage layer 21 is provided upper than the reference layer 22 and the shift canceling layer 24.

The under layer 25 is provided on the bottom electrode 12 and includes a first layer portion 25a and a second layer portion 25b. The first layer portion 25a contains hardly oxidizable metal which is hard to oxidize, such as N, Ta, Ru or Ti. The first layer portion 25a may be provided as a compound such as TaN or TiN. The second layer portion 25b contains at least one easily oxidizable metal which is more easily oxidized than the hardly oxidizable metal used for the first layer portion 25a and is selected from, for example, Al, Be, Mg, Ca, Sr, Hf, Ba, Sc, Y, La, and Zr. The second layer portion 25b is formed of, for example, HfB, MgAlB, HfAlB, ScAlB, ScHfB, HfMgB, or the like.

The hardly oxidizable metal and the easily oxidizable metal can be determined based on, for example, its standard electrode potential. That is, when second metal in the second layer portion 25b has a standard electrode potential lower than that of first metal in the first layer portion 25a, the second metal can be defined as the easily oxidizable metal. On the other hand, when the first metal in the first layer portion 25a has a standard electrode potential higher than that of the second metal in the second layer portion 25b, the first metal can be defined as the hardly oxidizable metal.

The cap layer 26 is provided between the storage layer 21 and a hard mask layer 30, and is formed using a predetermined metal material. For example, the cap layer 26 may be formed of a nitrogen compound or an oxygen compound, or a compound thereof. The intermediate layer 27 is provided between the storage layer 21 and the cap layer 26.

The hard mask layer 30 provided on the stacked structure 20 is used as an etching mask when a pattern of the stacked structure 20 is formed by ion beam etching (IBE).

On a sidewall of the stacked structure 20, a first sidewall insulating layer 41 is provided. The first sidewall insulating layer 41 is provided along the sidewall of the stacked structure 20, and an upper end of the first sidewall insulating layer 41 is located lower than an upper surface of the tunnel barrier layer 23. In this embodiment, the upper end of the first sidewall insulating layer 41 is located lower than a lower surface of the tunnel barrier layer 23. Further, in this embodiment, the upper end of the it sidewall insulating layer 41 is located higher than a lower surface of the reference layer 22. More specifically, the upper end of the first sidewall insulating layer 41 is located higher than a lower surface of the first layer portion 22a of the reference layer 22. The first sidewall insulating layer 41 is formed of an insulating material such as nitride or oxide. As will be described later, the first sidewall insulating layer 41 mainly functions as a protective film against IBE.

On the sidewall of the stacked structure 20, a second sidewall insulating layer 42 is provided. The second sidewall insulating layer 42 is provided along the sidewall of the stacked structure 20 and covers the first sidewall insulating layer 41. In this embodiment, the second sidewall insulating layer 42 covers the entire sidewall of the stacked structure 20 and the entire sidewall of the hard mask layer 30. Specifically, the second sidewall insulating layer 42 is formed of a nitride layer such as a silicon nitride (SiN) layer, an aluminum nitride (AlN) layer, or a hafnium nitride (HEFT) layer. The second sidewall insulating layer 42 mainly functions as a protective film for protecting a magnetoresistive element.

A redeposition layer (first redeposition layer) 43 made of hardly oxidizable metal is interposed between the stacked structure 20 and the first sidewall insulating layer 41. The redeposition layer 43 is provided along the sidewall of the stacked structure 20, and a position in a height direction of an upper end of the redeposition layer 43 is substantially the same as a position in a height direction of the upper end of the first sidewall insulating layer 41. The redeposition layer 43 is a layer which redeposits to the sidewall of the stacked structure 20 when the pattern of the stacked structure 20 is formed by IBE. Accordingly, the redeposition layer 43 contains the same metal element as a metal element contained in the stacked structure 20. For example, the redeposition layer 43 contains hardly oxidizable metal and the like.

On a portion of the sidewall of the stacked structure 20, which is located higher than the upper end of the first sidewall insulating layer 41, no redeposition layer is provided, or a second redeposition layer (not shown) thinner than the first redeposition layer 43 is provided.

A structure including the stacked structure 20, the hard mask layer 30, the first sidewall insulating layer 41, the second sidewall insulating layer 42, and the first redeposition layer 43 is covered with an interlayer insulating film 51. A hole is formed in the interlayer insulating film 51 and the second sidewall insulating layer 42, and a top electrode 52 is provided in the hole. A magnetoresistive element and a bit line (not shown) are electrically connected by the top electrode 52.

The magnetoresistive element is an STT (spin transfer torque) type magnetoresistive element having perpendicular magnetization. That is, each of the storage layer 21, the reference layer 22, and the shift canceling layer 24 has a magnetization direction perpendicular to its main surface.

The resistance of the stacked structure 20 for the magnetoresistive element is lower when the magnetization direction of the storage layer 21 is parallel to the magnetization direction of the reference layer 22 than when the magnetization direction of the storage layer 21 is antiparallel to the magnetization direction of the reference layer 22. That is, when the magnetization direction of the storage layer 21 is parallel to the magnetization direction of the reference layer 22, the stacked structure 20 exhibits a low resistance state, and when the magnetization direction of the storage layer 21 is antiparallel to the magnetization direction of the reference layer 22, the stacked structure 20 exhibits a high resistance state. Accordingly, the magnetoresistive element can store binary data (0 or 1) according to the resistance state (low resistance state and high resistance state). The resistance state of the magnetoresistive element can be set according to the direction of write current flowing through the magnetoresistive element (stacked structure 20).

Next, a method of manufacturing the magnetic memory device (semiconductor integrated circuit device) according to this embodiment will be described with reference to FIGS. 2 to 6 and FIG. 1.

Figure 2:
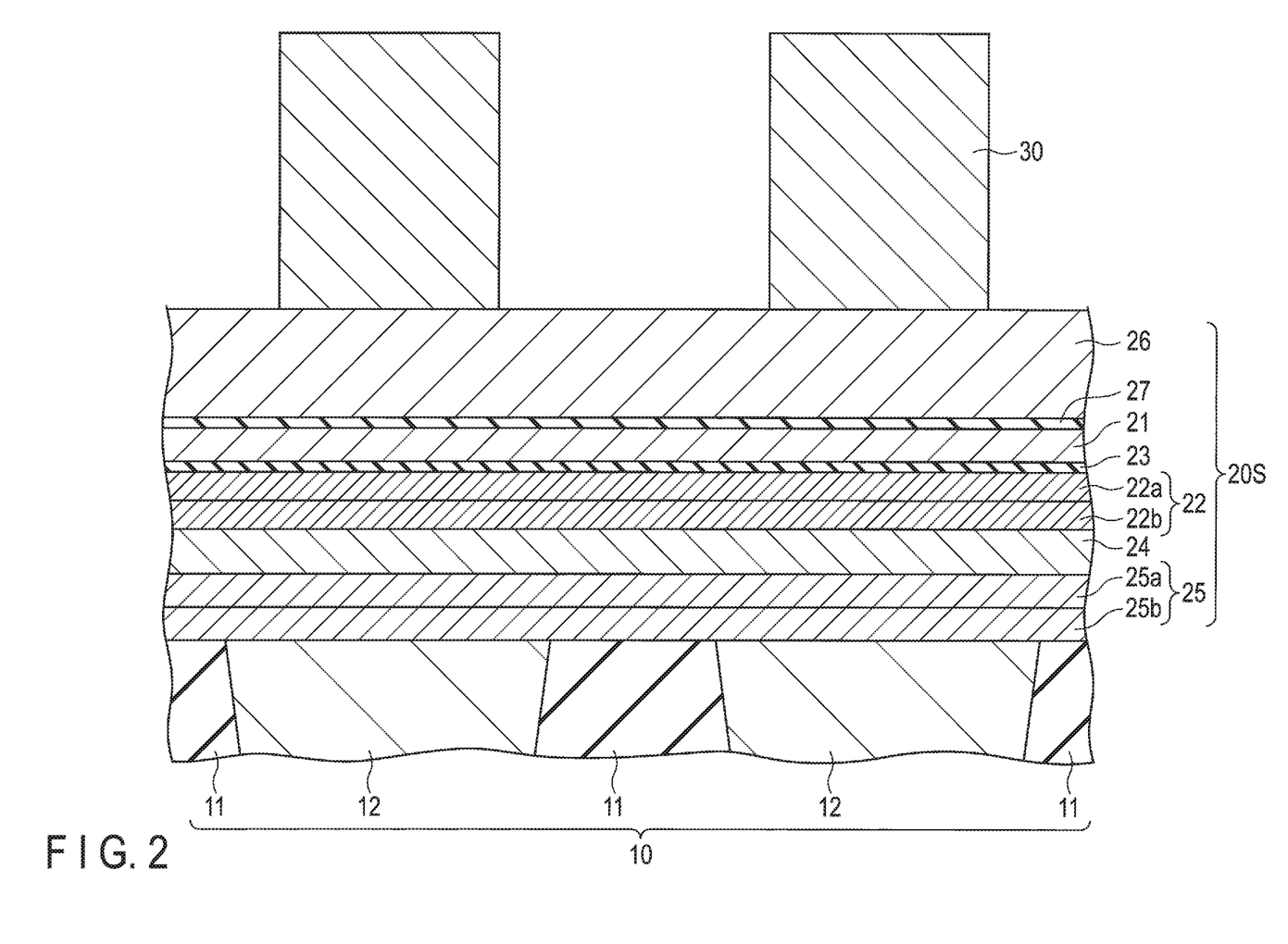
FIG. 2 is a cross-sectional view schematically showing a part of a magnetic memory device manufacturing method according to the embodiment.

First, as shown in FIG. 2, the lower structure 10 including a semiconductor substrate (not shown), a MOS transistor (not shown), the interlayer insulating film 11, the bottom electrode 12 and the like is formed.

Then, a stacked film 20S is formed on the lower structure 10 mainly by sputtering. More specifically, on the lower structure 10, the under layer 25 (first layer portion 25a and second layer portion 25b), the shift canceling layer 24, the reference layer 22 (first layer portion 22a and second layer portion 22b), the tunnel barrier layer 23, the storage layer 21, the intermediate layer 27, and the cap layer 26 are sequentially deposited. Subsequently, the stacked film 20S is annealed. Thereby, layers included in the stacked film 20S is crystallized.

Then, a pattern of the hard mask layer 30 is formed on the stacked film 20S by lithography and etching.

Figure 3:
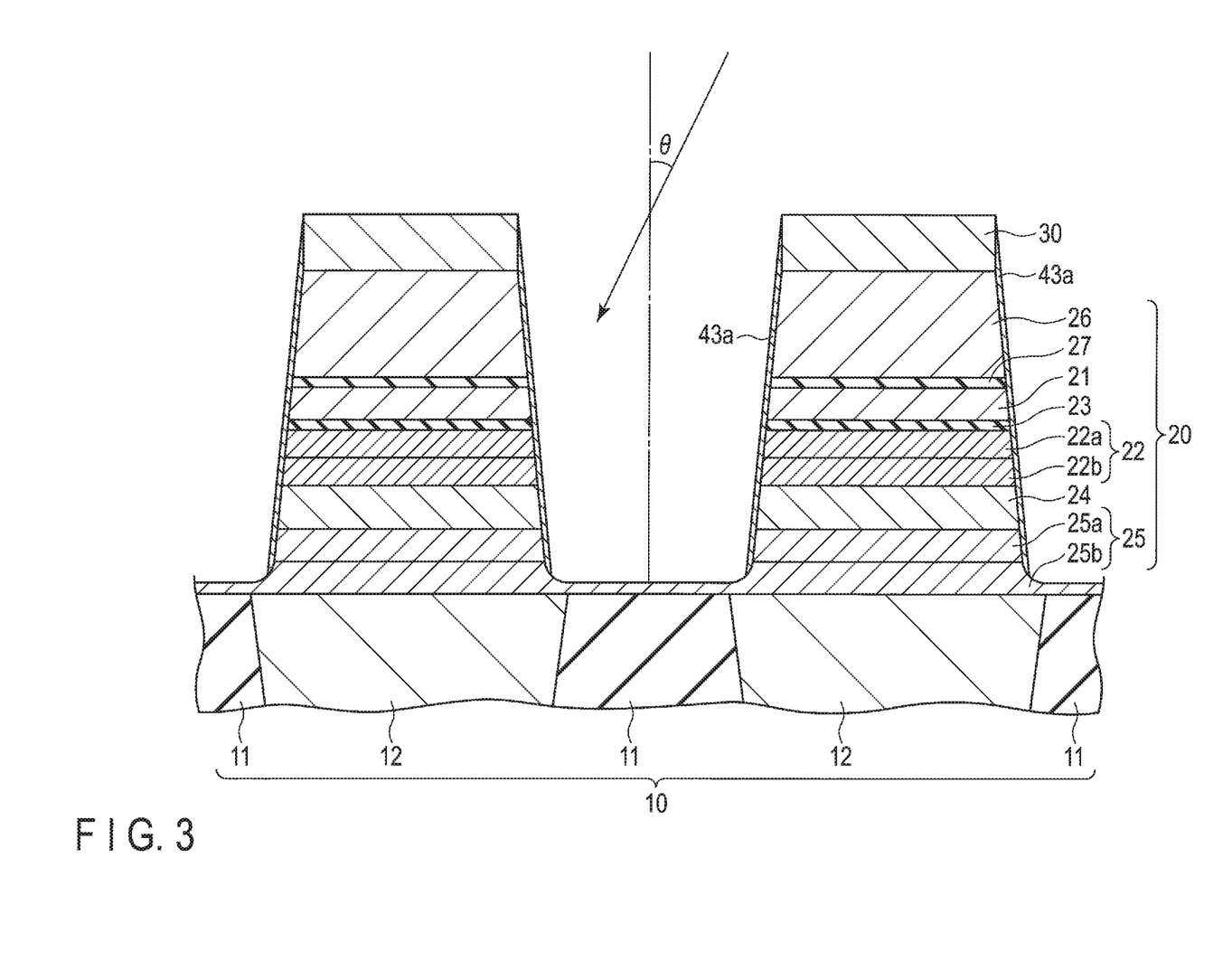
FIG. 3 is a cross-sectional view schematically showing a part of the magnetic memory device manufacturing method according to the embodiment.

Then, as shown in FIG. 3, the stacked film 20S is patterned to form the stacked structure 20. Specifically, the hard mask layer 30 is used as an etching mask, and the stacked film 20S is patterned by IBE while rotating a semiconductor wafer provided with the stacked film 20S around its central axis as a rotation axis. Specifically, the stacked film 20S is irradiated with an ion beam while changing an incident angle θ of the ion beam (incident angle to the main surface of the lower structure 10, that is, an angle formed between a direction perpendicular to the main surface of the lower structure 10 and the ion beam). For example, the ion beam is applied at an incident angle larger than 30 degrees from IBE start time t0 to time t1, the ion beam is applied at an incident angle smaller than 30 degrees from time t1 to time t2, and the ion beam is applied at an incident angle larger than 30 degrees from time t2 to time t3.

In this patterning process, a redeposition layer 43a of hardly oxidizable metal is formed on the sidewall of the stacked structure 20. That is, the electroconductive redeposition layer 43a containing the same metal element as the metal element contained in the stacked structure 20 (stacked film 20S) is formed. Since the hard mask layer 30 is also etched by IBE, the thickness of the hard mask layer 30 is reduced.

Figure 4:
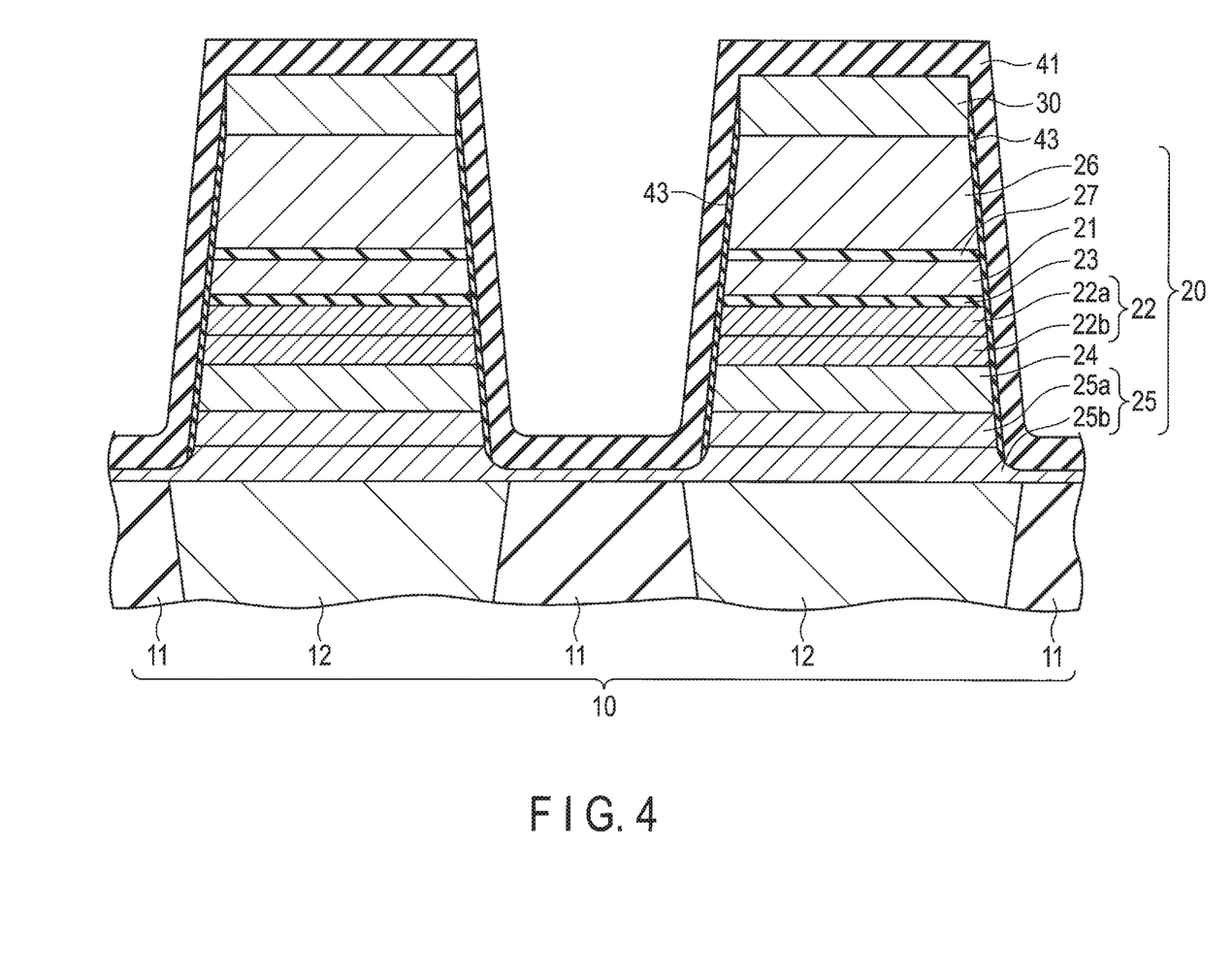
FIG. 4 is a cross-sectional view schematically showing a part of the magnetic memory device manufacturing method according to the embodiment.

Then, as shown in FIG. 4, the electroconductive redeposition layer 43a is oxidized to insulate the redeposition layer 43. Subsequently, the first sidewall insulating layer 41 is formed along the sidewall of the stacked structure 20. Although the first sidewall insulating layer 41 may be formed at least along the sidewall surface of the stacked structure 20, it is actually formed along an upper surface of the hard mask layer 30, a sidewall surface of the hard mask layer 30, a sidewall surface of the stacked structure 20, and an upper surface of the lower structure 10. For the first sidewall insulating layer 41, for example, nitride, oxide, or the like is used. The redeposition layer 43 is covered with the first sidewall insulating layer 41.

Figure 5:
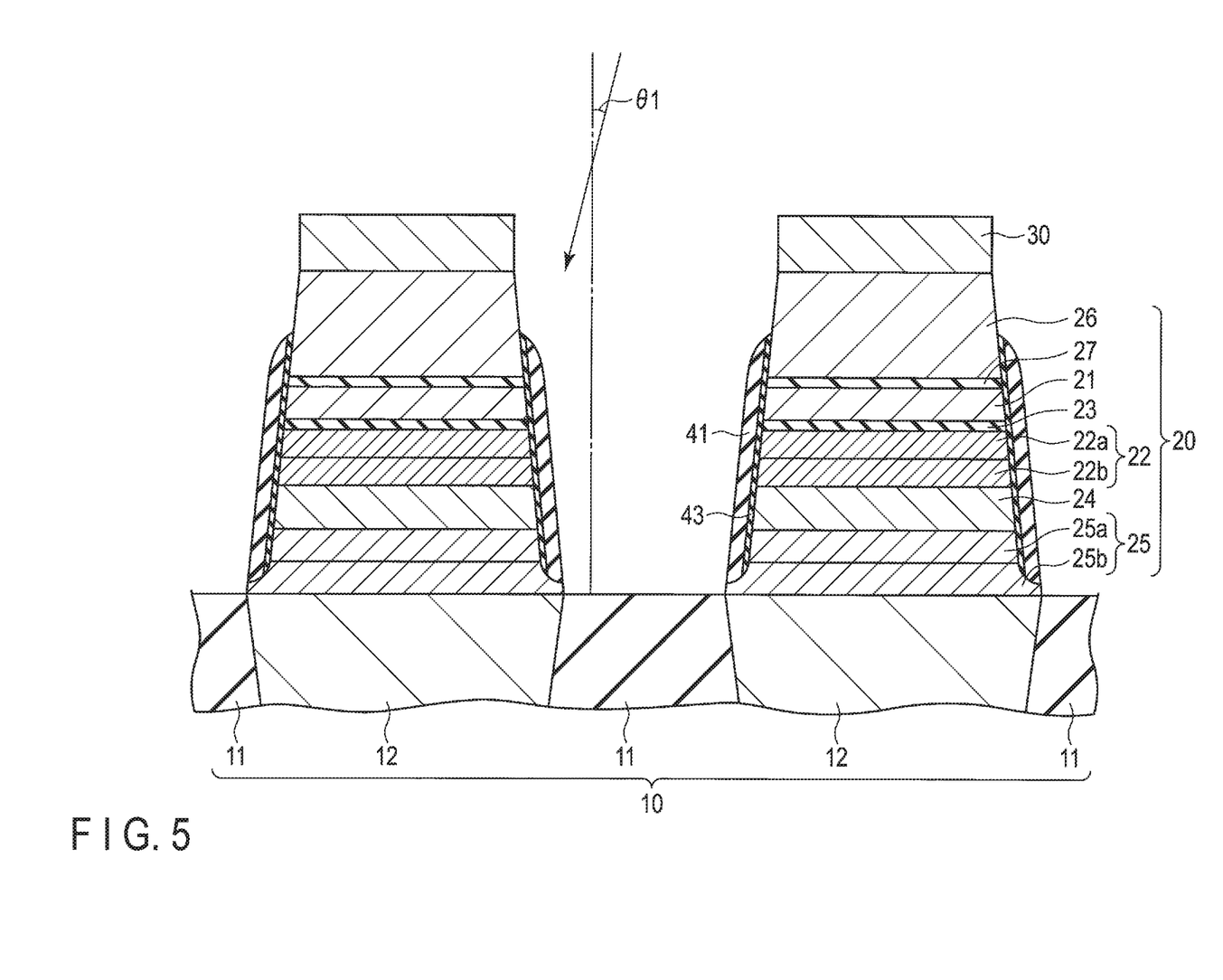
FIG. 5 is a cross-sectional view schematically showing a part of the magnetic memory device manufacturing method according to the embodiment.

Then, as shown in FIG. 5, the first sidewall insulating layer 41 is etched by IBE while rotating a semiconductor wafer provided with the stacked structure 20 around its central axis as a rotation axis. Specifically, the first sidewall insulating layer 41 is irradiated with an ion beam at a first incident angle θ1 (incident angle to the main surface of the lower structure 10) smaller than 30 degrees. As a result, the upper end of the first sidewall insulating layer 41 formed along the sidewall of the stacked structure 20 recedes. The first sidewall insulating layer 41 formed on the upper surface of the hard mask layer, the side surface of the hard mask layer 30, and the upper surface of the lower structure 10 is also removed by the IBIS process. In addition, by the IBE process, the redeposition layer 43 exposed by receding the upper end of the first sidewall insulating layer 41 is etched, and the upper end of the redeposition layer 43 formed along the sidewall of the stacked structure 20 recedes.

In the present IBE process (IBE process at the first incident angle θ1), the IBE process is controlled such that the upper end of the first sidewall insulating layer 41 and the upper end of the redeposition layer 43 are located higher than the upper surface of the tunnel barrier layer 23 once the IBE process is terminated. In this embodiment, the IBE process is controlled such that the upper end of the first sidewall insulating layer 41 and the upper end of the redeposition layer 43 are located higher than the upper surface of the storage layer 21 once the IBE process is terminated.

Figure 6:
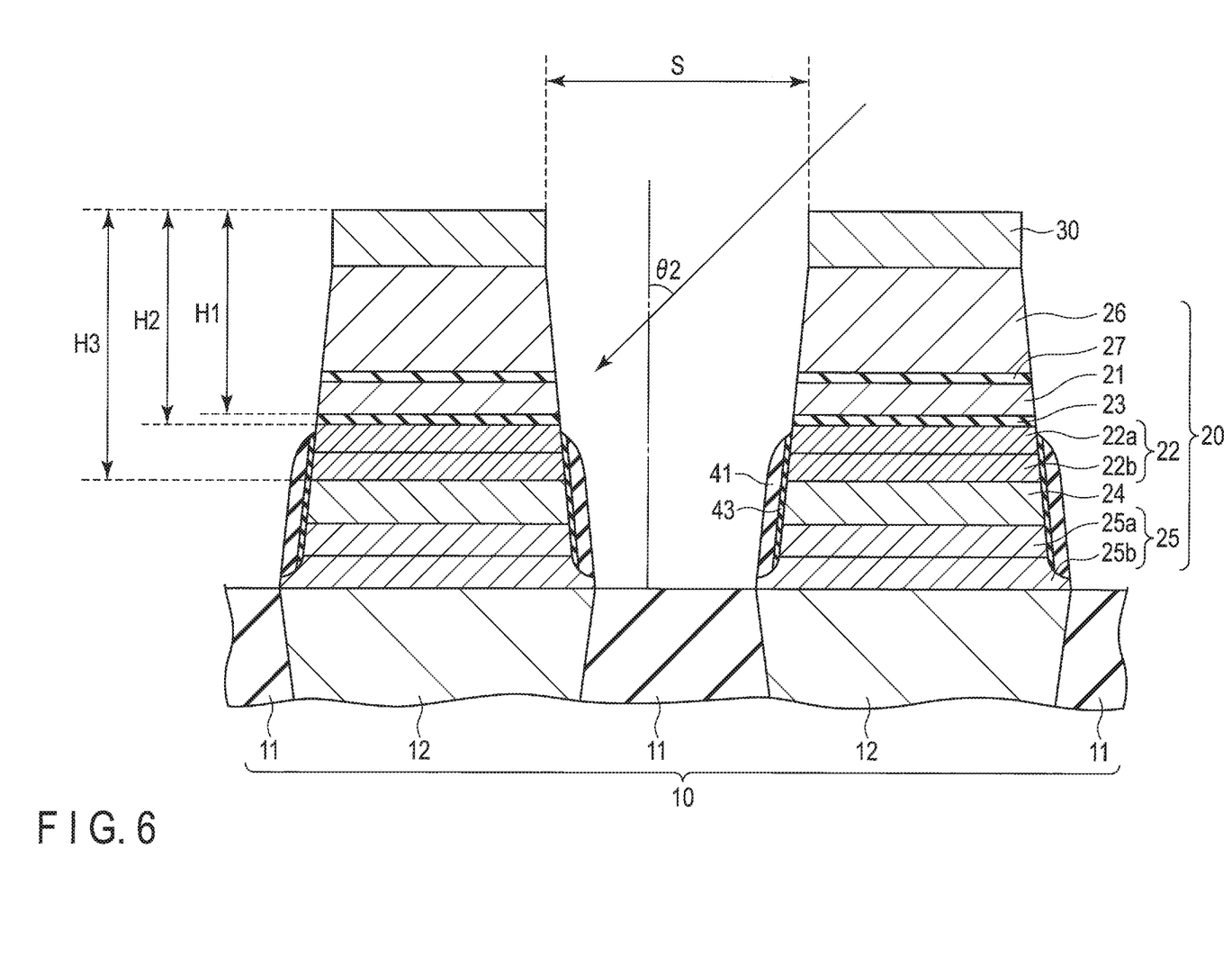
FIG. 6 is a cross-sectional view schematically showing a part of the magnetic memory device manufacturing method according to the embodiment.

Then, as shown in FIG. 6, the first sidewall insulating layer 41 is etched while changing the incident angle to the main surface of the lower structure 10 in IBE. Specifically, the first sidewall insulating layer 41 is irradiated with an ion beam at a second incident angle θ2 (incident angle to the main surface of the lower structure 10) larger than the first incident angle θ1. More specifically, the first sidewall insulating layer 41 is irradiated with the ion beam at the second incident angle θ2 larger than 30 degrees. As a result, the upper end of the first sidewall insulating layer 41 formed along the sidewall of the stacked structure 20 further recedes. By the IBE process, the redeposition layer 43 further exposed by further receding the upper end of the first sidewall insulating layer 41 is etched, and the upper end of the redeposition layer 43 formed along the sidewall of the stacked structure 20 further recedes.

In the present IBE process (IBE process at the second incident angle θ2), the IBE process is controlled such that the upper end of the first sidewall insulating layer 41 and the upper end of the redeposition layer 43 are located lower than the upper surface of the tunnel barrier layer 23 once the IBE process is terminated. More preferably, the IBE process is controlled such that the upper end of the first sidewall insulating layer 41 and the upper end of the redeposition layer 43 are located lower than the lower surface of the tunnel barrier layer 23 once the IBE process is terminated. Specifically, the IBE process is controlled such that the upper end of the first sidewall insulating layer 41 and the upper end of the redeposition layer 43 are located between the lower surface and the upper surface of the reference layer 22. In this embodiment, IBE is terminated immediately after the upper end of the first sidewall insulating layer 41 and the upper end of the redeposition layer 43 become lower than the lower surface of the tunnel barrier layer 23.

The second incident angle θ2 is determined as follows. As shown in FIG. 6, a space width between the hard mask layers 30 adjacent to each other is represented by S. The height from the upper surface of the tunnel barrier layer 23 to the upper surface of the hard mask layer 30 is represented by H1, and the height from the lower surface of the tunnel barrier layer 23 to the upper surface of the hard mask layer 30 is represented by H2. At this time, "tan θ2<S/H1" is preferable, and "tan θ2<S/H2" is more preferable. The following description is added.

When a plurality of the stacked structures 20 are formed by IBE, there may be a region (shadow region) where the ion beam is obstructed by a so-called shadow effect. The shadow region depends on the angle of the ion beam. Specifically, as the incident angle of the ion beam increases, the shadow region increases. From a geometrical viewpoint, theoretically, in the case of "tan θ2=S/H1", the shadow region is generated at a position lower than the upper surface of the tunnel barrier layer 23. Accordingly, by satisfying "tan θ2<S/H1", no shadow region is generated at a position higher than the upper surface of the tunnel barrier layer 23, and the first sidewall insulating layer 41 and the redeposition layer 43 can be reliably etched at least up to a position corresponding to the upper surface of the tunnel barrier layer 23. By satisfying "tan θ2<S/H2", the first sidewall insulating layer 41 and the redeposition layer 43 can be reliably etched up to a position corresponding to the lower surface of the tunnel barrier layer 23.

However, if the incident angle 92 is too small (tan θ2 is too small), it is difficult to set the upper end of the first sidewall insulating layer 41 and the upper end of the redeposition layer 43 at a suitable position once IBE is terminated. Accordingly, there is a suitable lower limit for the incident angle θ2. For example, when control is performed such that the upper end of the first sidewall insulating layer 41 and the upper end of the redeposition layer 43 are located between the lower surface and the upper surface of the reference layer 22, the incident angle θ2 is set such that "S/H3<tan θ2<S/H2". H3 is the height from the lower surface of the reference layer 22 to the upper surface of the hard mask layer 30.

As described above, in the case where, after IBE is performed at the first incident angle θ1, IBE is performed at the second incident angle θ2 larger than the first incident angle θ1, as described below, the redeposition layer 43 containing hardly oxidizable metal can be accurately removed, and an electrical short failure can be suppressed.

In the process of FIG. 5, IBE is performed at the relatively small first incident angle θ1. Thus, the upper end of the first sidewall insulating layer 41 and the upper end of the redeposition layer 43 can be accurately receded on the sidewall of the stacked structure 20. However, since IBE is performed at the relatively small first incident angle θ1, a redeposition layer formed on the sidewall of the stacked structure 20 cannot be completely removed by the IBE. In the process of FIG. 6, IBE is performed at the relatively large second incident angle θ2. Thus, the redeposition layer formed on the sidewall of the stacked structure 20 in the process of FIG. 5 can be efficiently removed. When the second incident angle θ2 is accurately set in consideration of the shadow effect, the upper end of the first sidewall insulating layer 41 and the upper end of the redeposition layer 43 can be set to a desired suitable position lower than the upper surface of the tunnel barrier layer 23 (preferably lower than the lower surface of the tunnel barrier layer 23). Accordingly, it is possible to effectively suppress electrical short failure (electric short failure between the storage layer 21 and the reference layer 22) resulting from the redeposition layer on the sidewall of the tunnel barrier layer 23.

When IBE is controlled such that the upper end of the first sidewall insulating layer 41 and the upper end of the redeposition layer 43 are lower than the lower surface of the tunnel barrier layer 23, the redeposition layer can be removed from the entire sidewall of the tunnel barrier layer 23, and therefore, the electric short failure between the storage layer 21 and the reference layer 22 can be more reliably suppressed.

After the process of FIG. 6 is completed as described above, as shown in FIG. 1, the second sidewall insulating layer 42 covering the first sidewall insulating layer 41 is formed along the sidewall of the stacked structure 20. More specifically, the second sidewall insulating layer 42 is formed along the upper surface of the hard mask layer 30, the sidewall surface of the hard mask layer 30, the sidewall surface of the stacked structure 20, and the upper surface of the lower structure 10.

Then, the interlayer insulating film 51 is formed to cover the structure including the stacked structure 20, the hard mask layer 30, the first sidewall insulating layer 41, the second sidewall insulating layer 42, and the first redeposition layer 43. Subsequently, the hole reaching the hard mask layer 30 is formed in the interlayer insulating film 51 and the second sidewall insulating layer 42. In addition, the top electrode 52 is formed in the hole.

Although the illustration of the subsequent processes is omitted, a magnetic memory device is formed by performing, for example, a process of forming a bit line, connected to the top electrode 52, on the interlayer insulating film 51.

As described above, in this embodiment, the upper end of the first sidewall insulating layer 41 formed along the sidewall of the stacked structure 20 is receded, so that the upper end of the first sidewall insulating layer 41 and the upper end of the redeposition layer 43 are positioned lower than the upper surface (more preferably the lower surface) of the tunnel barrier layer (nonmagnetic layer) 23. When the upper end of the first sidewall insulating layer 41 is thus receded to a suitable position, it is possible to effectively suppress electrical short failure resulting from the redeposition layer on the sidewall of the tunnel barrier layer 23. As a result, it is possible to obtain a magnetoresistive element having excellent characteristics and reliability.

In particular, in this embodiment, the reference layer 22 is provided between the lower structure 10 and the tunnel barrier layer 23, and the shift canceling layer 24 is provided between the lower structure 10 and the reference layer 22. That is, the reference layer 22 and the shift canceling layer 24 are provided under the tunnel barrier layer 23. In general, the reference layer 22 and the shift canceling layer 24 are thicker than the storage layer 21. Thus, when the pattern of the stacked structure 20 is formed by IBE, the thick reference layer 22 and the shift canceling layer 24 are required to be etched after the tunnel barrier layer 23 is etched, and the electroconductive redeposition layer tends to adhere on the sidewall of the tunnel barrier layer 23. In some cases, the reference layer 22 and the shift canceling layer 24 may contain hardly oxidizable metal. By using the configuration and method of this embodiment, it is possible to accurately remove the redeposition layer on the sidewall of the tunnel barrier layer 23, and to effectively suppress electrical short failure.

Figure 7:
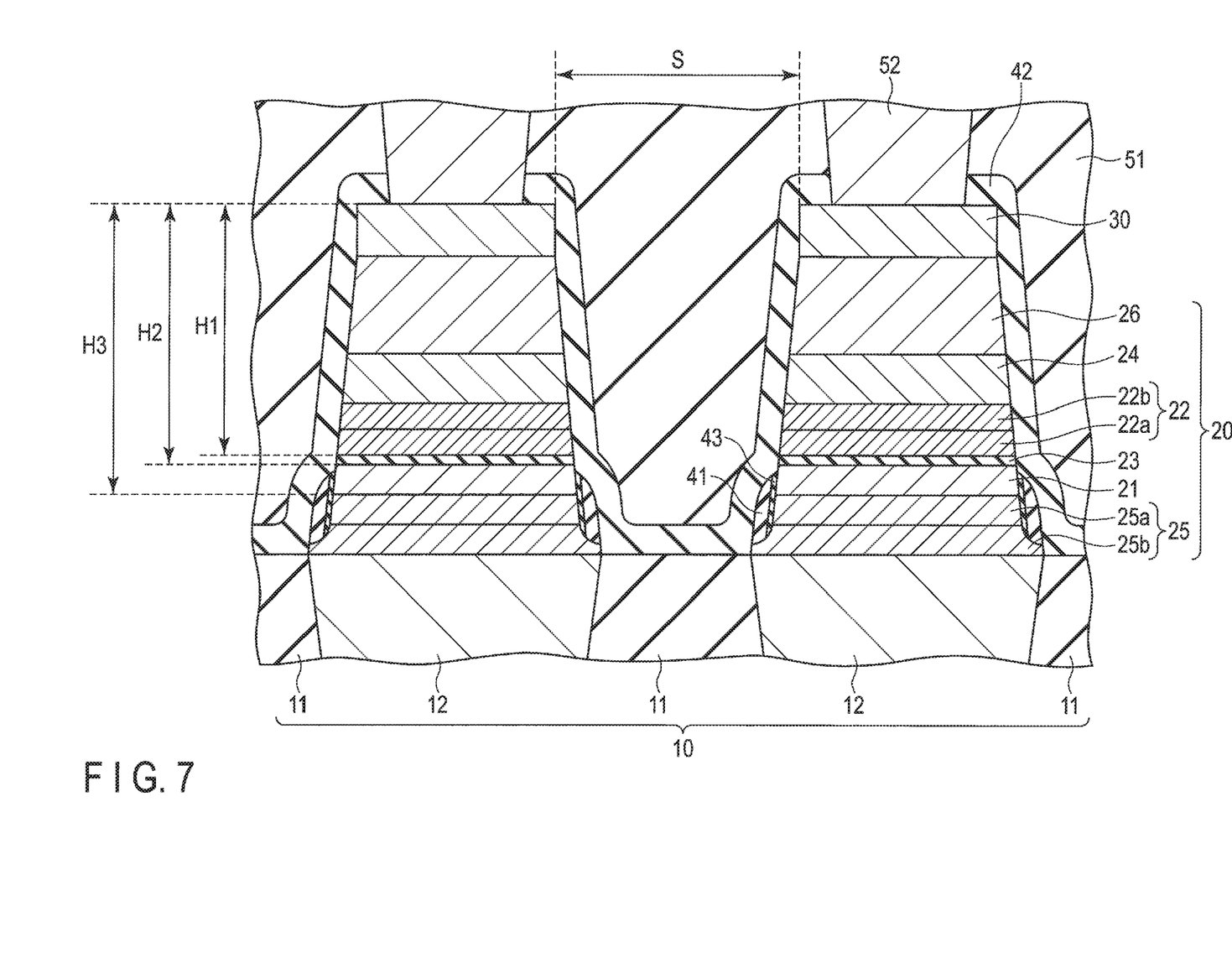
FIG. 7 is a cross-sectional view schematically showing a configuration of a modification of the magnetic memory device according to the embodiment.

FIG. 7 is a cross-sectional view schematically showing a configuration of a magnetic memory device according to a modification of this embodiment. Since the basic matters are the same as those of the above embodiment, the explanations of matters that are described in the above embodiment are omitted. In addition, components corresponding to those described in the above embodiment are denoted by the same reference numerals.

In the above embodiment, the reference layer (second magnetic layer) 22 and the shift canceling layer (third magnetic layer) 24 are provided between the lower structure 10 and the tunnel barrier layer 23 (nonmagnetic layer). In this modification, the storage layer (first magnetic layer) 21 is provided between the lower structure 10 and the tunnel barrier layer (nonmagnetic layer) 23. That is, in this modification, in the stacked structure 20, the under layer 25, the storage layer 21, the tunnel barrier layer 23, the reference layer 22, the shift canceling layer 24, and the cap layer 26 are stacked in this order.

Also in this modification, on the sidewall of the stacked structure 20, the first sidewall insulating layer 41 is provided along the sidewall of the stacked structure 20. Also in this modification, the upper end of the first sidewall insulating layer 41 is located lower than the upper surface of the tunnel barrier layer 23 and is preferably located lower than the lower surface of the tunnel barrier layer 23. The upper end of the first sidewall insulating layer 41 is preferably located higher than the lower surface of the storage layer 21. Also in this modification, on the sidewall of the stacked structure 20, the second sidewall insulating layer 42 is provided along the sidewall of the stacked structure 20, and the second sidewall insulating layer 42 covers the first sidewall insulating layer 41.

The basic manufacturing method is the same as the manufacturing method of the above embodiment, and the first sidewall insulating layer 41 shown in FIG. 7 is formed as follows. First, the IBE process is performed at the first incident angle θ1 such that the upper end of the first sidewall insulating layer 41 and the upper end of the redeposition layer 43 are located higher than the upper surface of the tunnel barrier layer 23. Subsequently, the IBE process is performed at the second incident angle θ2 larger than the first incident angle θ1 such that the upper end of the first sidewall insulating layer 41 and the upper end of the redeposition layer 43 are located lower than the upper surface of the tunnel barrier layer 23 (more preferably located lower than the lower surface of the tunnel barrier layer 23). Specifically, the IFS process is performed such that the upper end of the first sidewall insulating layer 41 and the upper end of the redeposition layer 43 are located between the lower surface and the upper surface of the storage layer 21. As a result, the first sidewall insulating layer 41 and the redeposition layer 43 as shown in FIG. 7 are obtained.

When H1, H2, and S are defined as in FIG. 1 of the first embodiment and H3 is defined as the height from the lower surface of the storage layer 21 to the upper surface of the hard mask layer 30, the incident angle θ2 is preferably set such that "S/H3<tan θ2<S/H2".

Also in this modification, as in the above embodiment, when the upper end of the first sidewall insulating layer 41 and the upper end of the redeposition layer 43 are set to a suitable height, it is possible to effectively suppress electrical short failure and to obtain a magnetoresistive element having excellent characteristics and reliability.

Figure 8:
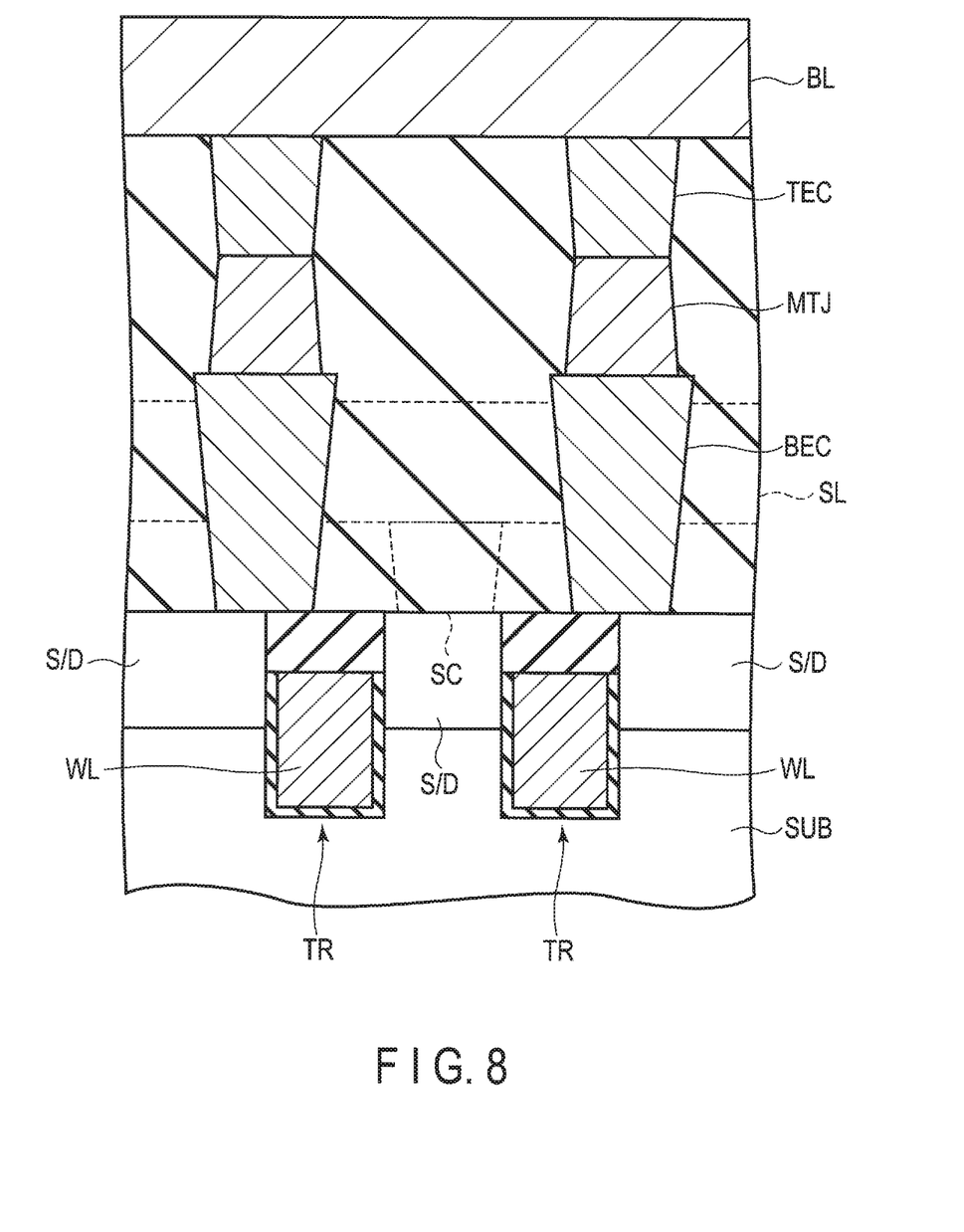
FIG. 8 is a cross-sectional view schematically showing an example of a general configuration of a semiconductor integrated circuit device to which the magnetoresistive element of the embodiment is applied.

FIG. 8 is a cross-sectional view schematically showing an example of a general configuration of a semiconductor integrated circuit device to which the magnetoresistive element of the above embodiment is applied.

A buried gate type MOS transistor TR is formed in a semiconductor substrate SUB. A gate electrode of the MOS transistor TR is used as a word line WL. A bottom electrode BEC is connected to one of source/drain regions S/D of the MOS transistor TR, and a source Line contact SC is connected to the other of the source/drain regions S/D.

A magnetoresistive element MTJ is formed on the bottom electrode BEC, and a top electrode TEC is formed on the magnetoresistive element MTJ. A bit line BL is connected to the top electrode TEC. A source line SL is connected to the source line contact SC.

An excellent semiconductor integrated circuit device can be obtained by applying the magnetoresistive element as described in the above embodiment to the semiconductor integrated circuit device as shown in FIG. 8.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
   a semiconductor substrate;
   a stacked structure provided above the semiconductor substrate and including a first magnetic layer having a variable magnetization direction, a second magnetic layer having a fixed magnetization direction, and a nonmagnetic layer provided between the first magnetic layer and the second magnetic layer;
   a bottom electrode provided between the semiconductor substrate and the stacked structure; and
   a first sidewall insulating layer provided along a sidewall of the stacked structure,
   wherein a height of an upper end of the first sidewall insulating layer from an interface between the stacked structure and the bottom electrode is less than a height of an upper surface of the nonmagnetic layer from the interface between the stacked structure and the bottom electrode.

2. The device according to claim 1, wherein the height of the upper end of the first sidewall insulating layer from the interface between the stacked structure and the bottom electrode is less than a height of a lower surface of the nonmagnetic layer from the interface between the stacked structure and the bottom electrode.

3. The device according to claim 1, further comprising a second sidewall insulating layer provided along the sidewall of the stacked structure and covering the first sidewall insulating layer.

4. The device according to claim 1, wherein the first sidewall insulating layer contains at least silicon (Si).

5. The device according to claim 1, further comprising a first redeposition layer interposed between the stacked structure and the first sidewall insulating layer and containing a same metal element as a metal element contained in the stacked structure.

6. The device according to claim 5, wherein on a portion of the sidewall of the stacked structure, which is located higher than the upper end of the first sidewall insulating layer, no redeposition layer is provided, or a second redeposition layer thinner than the first redeposition layer is provided.

7. The device according to claim 5, wherein the first redeposition layer contains hardly oxidizable metal.

8. The device according to claim 1, wherein the second magnetic layer is provided between the bottom electrode and the nonmagnetic layer.

9. The device according to claim 8, wherein the stacked structure further includes a third magnetic layer provided between the bottom electrode and the second magnetic layer, the third magnetic layer having a fixed magnetization direction antiparallel to the magnetization direction of the second magnetic layer.

10. The device according to claim 1, wherein the first magnetic layer is provided between the bottom electrode and the nonmagnetic layer.

* * * * *